United States Patent [19]

Majima et al.

[11] Patent Number: 5,225,835
[45] Date of Patent: Jul. 6, 1993

[54] SIGMA DELTA TYPE DIGITAL/ANALOG CONVERTER SYSTEM

[75] Inventors: Shin-ichi Majima; Mitsuru Nagata, both of Yokohama, Japan

[73] Assignee: Kabushiki Kaisha Toshiba, Kawasaki, Japan

[21] Appl. No.: 858,486

[22] Filed: Mar. 27, 1992

[30] Foreign Application Priority Data

Mar. 29, 1991 [JP] Japan .................................. 3-89012

[51] Int. Cl.$^5$ ............................................. H03M 3/00
[52] U.S. Cl. ..................................... 341/143; 341/131
[58] Field of Search ............... 341/131, 143, 159, 120, 341/144, 139, 140, 118; 375/26, 27, 33, 34

[56] References Cited

U.S. PATENT DOCUMENTS 5,061,925 10/1991 Sooch et al. ..................... 341/120
5,073,777 12/1991 Fukuhara et al. ................ 341/131

FOREIGN PATENT DOCUMENTS 0369630 5/1990 European Pat. Off. .
86/002217 4/1986 World Int. Prop. O. .

Primary Examiner—A. D. Pellinen
Assistant Examiner—Brian K. Young
Attorney, Agent, or Firm—Oblon, Spivak, McClelland, Maier & Neustadt

[57] ABSTRACT

An identical digital signal and a total of k different DC offset signals are provided to the respective ones of a total of k adders. Each of the adders outputs a signal representing the sum of the digital signal and the DC offset signal. The adders are connected to the respective $\Sigma\Delta$ type D/A converters and the output signals of the k type D/A converters are summed up to form a single output signal. Any two of the levels of the DC offset signals given to the k adders differ from each other by equal to or greater than 0.2% of the full scale value of the $\Sigma\Delta$ type D/A converters. With such an arrangement, the performance of the $\Sigma\Delta$ type D/A converters can be remarkably improved without raising the sampling rate and the number of orders of the type D/A converters.

4 Claims, 9 Drawing Sheets

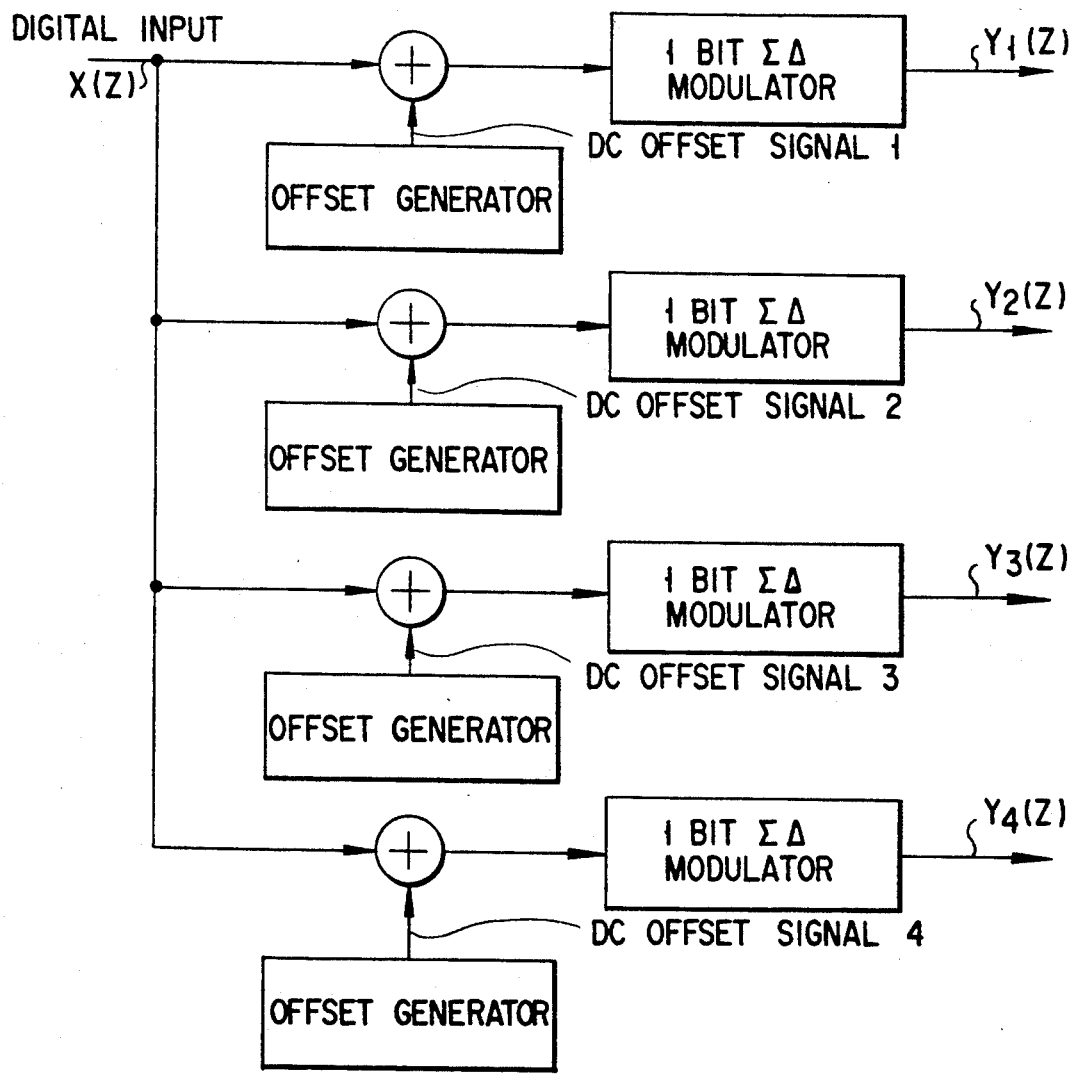
F I G. 5

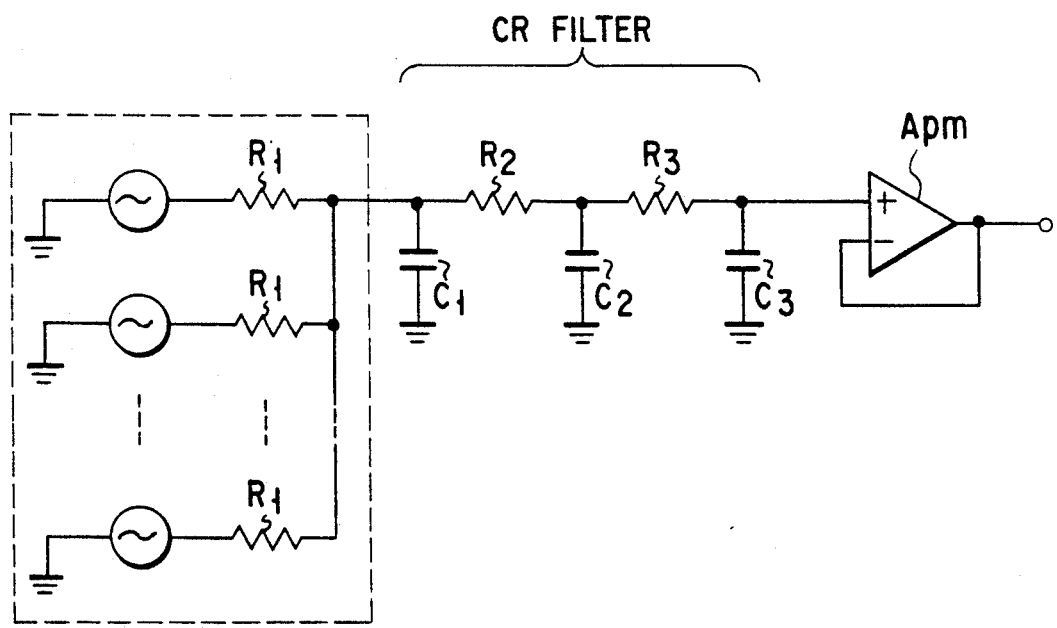
F I G. 10

SIGMA DELTA TYPE DIGITAL/ANALOG CONVERTER SYSTEM

BACKGROUND OF THE INVENTION

1. Field of the Invention

This invention generally relates to an improvement to the over-sampling type digital/analog converter for carrying out digital/analog conversions at a frequency by far much higher than the signal frequency in order to achieve a high S/N level and, more particularly, it relates to an improvement to the sigma delta type digital/analog converter (hereinafter referred to as $\Sigma\Delta$ type D/A converter) comprising a digital sigma-delta modulator.

2. Description of the Related Art

Conventionally, the sampling frequency $f_S$ of a D/A converter is set to a value more than twice as large as that of the signal frequency bandwidth $f_B$ for digitizing the incoming analog signal in order to eliminate possibility of losing any information contained in the analog signal in the course of conversion. Such operation is theoretically justified by the Nyquist theorem. Thus, the sampling frequency $f_S$ of a conventional D/A converter is normally set to a value 2.2 to 2.4 times as large as that of the signal frequency bandwidth $f_B$.

Recently, there was developed a so-called over-sampling type D/A converter having a sampling frequency $f_S$ by far much higher than the signal frequency bandwidth $f_B$ in an attempt to enhance the accuracy of conversion and such converters have been widely used for practical applications. With the over sampling type D/A converter, the maximum value of the S/N ratio, or S/$N_{MAX}$, is expressed by formula (1) below.

$$S/N_{MAX} = (3/2) \cdot 2^{2n} \cdot (f_S/2f_B) \tag{1}$$

where n is the number of bits (resolution) of the digital signal.

As seen from formula (1) above, the level of S/$N_{MAX}$ is linearly proportional to the sampling frequency $f_S$ and, therefore, a high accuracy of conversion can be obtained by selecting a high sampling frequency $f_S$.

On the other hand, while S/$N_{MAX}$ can be quadrupled by incrementing the number of bits n by 1, it is only doubled by doubling the sampling frequency $f_S$. In view of this, a number of improvements have been proposed to the over-sampling type D/A converter in order to improve the S/N ratio without excessively raising the sampling frequency $f_S$.

The so-called $\Sigma\Delta$ type D/A converter comprising a sigma-delta modulator (hereinafter referred to as $\Sigma\Delta$ modulator) is an outcome of the efforts for such improvements. FIG. 1 of the accompanying drawings shows a circuit diagram of a $\Sigma\Delta$ type D/A converter provided with a primary $\Sigma\Delta$ modulator. In FIG. 1, 11 and 21 respectively denote a $\Sigma\Delta$ modulator and a D/A conversion circuit. X(z) and Y(z) are respectively the z transform value of input signal and that of output signal. E(z) is the z transform value of quantization error.

The $\Sigma\Delta$ type D/A converter of FIG. 1 operates in a manner as described below. Firstly, an input signal (digital signal) X(z) is applied to subtracter 13. The output signal of the subtracter 13 is then given to integrating circuit 14. The integrating circuit 14 comprises an adder 15 and a 1 clock delay circuit 16. The output signal of the integrating circuit 14 is then given to quantizer 17. A quantization error E(z) is produced when the output signal of the integrating circuit 14 is quantized by the quantizer 17. In other words, the output signal Y(z) of the quantizer 17 contains the quantization error E(z). The output signal Y(z) then passes through the 1 clock delay circuit 18 and is sent to the subtracter 13 as a feedback signal. The output signal Y(z) of the quantizer 17 is also applied to D/A converter 21 for digital/analog conversion.

In a $\Sigma\Delta$ type D/A converter as described above, equation (2) below holds true.

$$Y(z) = X(z) + (1 - z^{-1}) \cdot E(z) \tag{2}$$

The quantization error (Ez) is not related with the input signal X(z) and frequency characteristics is flat (or no frequency dependency). Therefore, the noise frequency characteristics of the $\Sigma\Delta$ type D/A converter can be expressed by formula (3) below.

$$(1 - e^{j\omega T}) = j\omega T \tag{3}$$

where $\omega$ is the angular frequency and $\omega T \ll 1$.

This means that the noise power is proportional to the square of the sampling frequency $(f_S)^3$ provided that the signal frequency bandwidth $f_B$ is sufficiently low relative to the sampling frequency $f_S$. Thus, the S/N level within the signal frequency bandwidth $f_B$ is improved by 9dB each time the sampling frequency $f_S$ is doubled. S/$N_{MAX}$ is expressed by formula (3)' below.

$$(S/N)_{MAX} = (9\pi/2) \cdot (f_S/2\pi f_B)^3 \tag{3}$$

FIG. 2 shows a circuit diagram of a $\Sigma\Delta$ type D/A converter provided with a $\Sigma\Delta$ modulator of a higher order. This D/A converter comprises an m-order integrating circuit 19 and has transfer characteristics as expressed by formula (4) below.

$$Y(z) = X(z) + (1 - z^{-1})^m \cdot E(z) \tag{4}$$

where m is the number of orders.

With a $\Sigma\Delta$ type D/A converter comprising a $\Sigma\Delta$ modulator of a higher order as described above, the S/N ratio is improved by $3 \times (2m+1)$dB within the signal frequency band-width $f_B$ each time the sampling frequency $f_S$ is doubled.

FIG. 3 shows a circuit diagram of another $\Sigma\Delta$ type D/A converter which is equivalent to the $\Sigma\Delta$ type D/A converter of FIG. 2. In FIG. 3, 20 denotes a filter circuit. This type D/A converter can make an m-order $\Sigma\Delta$ type D/A converter by giving its transfer function H(z) a value defined by formula (5) below.

$$H(z) = 1 - (1 - z^{-1})^m \tag{5}$$

With any of the $\Sigma\Delta$ type D/A converters as illustrated in FIGS. 1 through 3, either the sampling rate or the number of orders of $\Sigma\Delta$ modulator needs to be raised for improvement of performance. When the sampling rate exceeds a given level with such a D/A converter, however, the conversion rate of the D/A conversion circuit cannot accommodate the sampling rate any more. The use of a $\Sigma\Delta$ modulator having a too large number of orders in a $\Sigma\Delta$ type D/A converter can, on the other hand, result in a degraded stability of the related D/A conversion circuit, which in turn needs to be compensated by the use of a limiter for controlling the output amplitude, although such an additional arrangement may not be able to improve the overall performance of the converter.

SUMMARY OF THE INVENTION

In view of the above disadvantages of conventional $\Sigma\Delta$ D/A converters, it is therefore an object of the present invention to provide a $\Sigma\Delta$ type D/A converter that can present an improved performance without increasing the sampling rate nor the number of orders of the $\Sigma\Delta$ modulator it comprises.

According to the invention, the above object is achieved by providing a $\Sigma\Delta$ type D/A converter system comprising a total of k adders for receiving an identical digital signal and respective DC offset signals different from one another. Each of the adders then adds said digital signal and said DC offset signal to produce an output signal. The $\Sigma\Delta$ type D/A converter system also comprises a total of k $\Sigma\Delta$ type D/A converters which are connected to the respective adders for converting their output signals into analog signals. Then, the output signals of the k $\Sigma\Delta$ type D/A converters are summed up.

Any two of the levels of the DC offset signals given to said k adding means differs from each other by equal to or greater than 0.2% of the full scale value of said k $\Sigma\Delta$ type D/A converters.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 and 6 are circuit diagrams of another preferred embodiment of the $\Sigma\Delta$ type D/A converter system of the present invention;

FIG. 10 is a circuit diagram of a still another preferred embodiment of the $\Sigma\Delta$ type D/A converter system of the present invention.

DETAILED DESCRIPTION OF THE PREFERRED EMBODIMENT

Now, a first preferred embodiment of the present invention will be described in detail by referring to FIG. 4 of the accompanying drawings.

Figure 1:
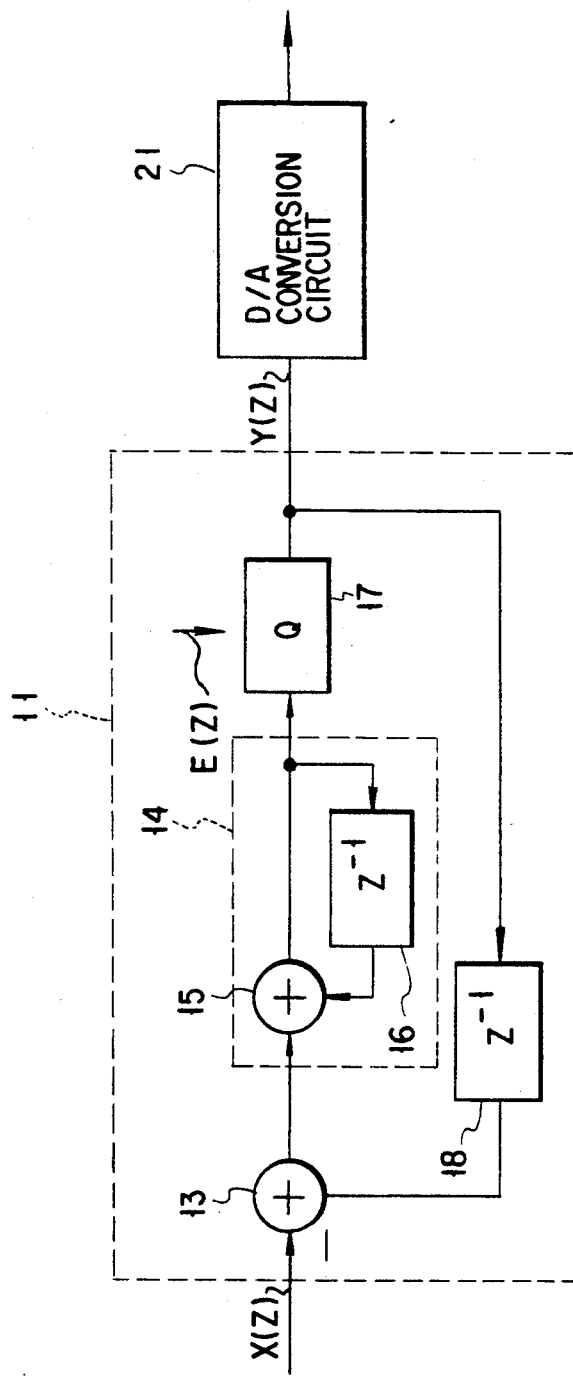
FIGS. 1 through 3 are circuit diagrams of three different conventional $\Sigma\Delta$ type D/A converters.
Figure 2:
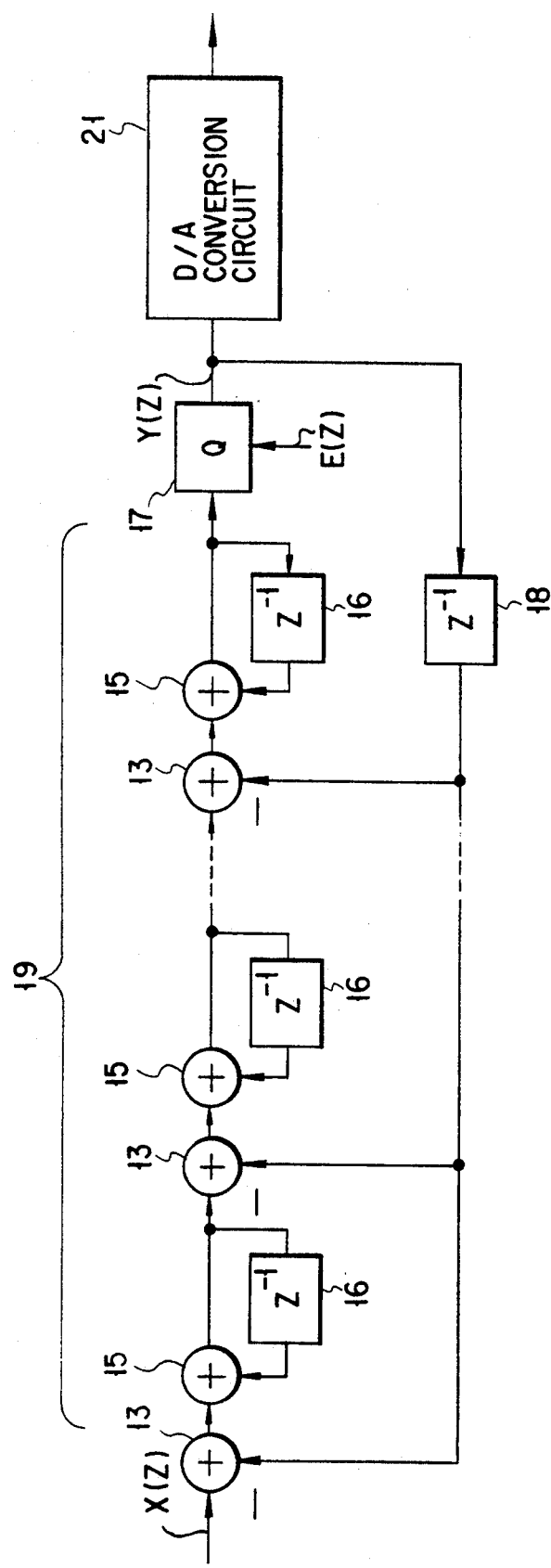
Figure 3:
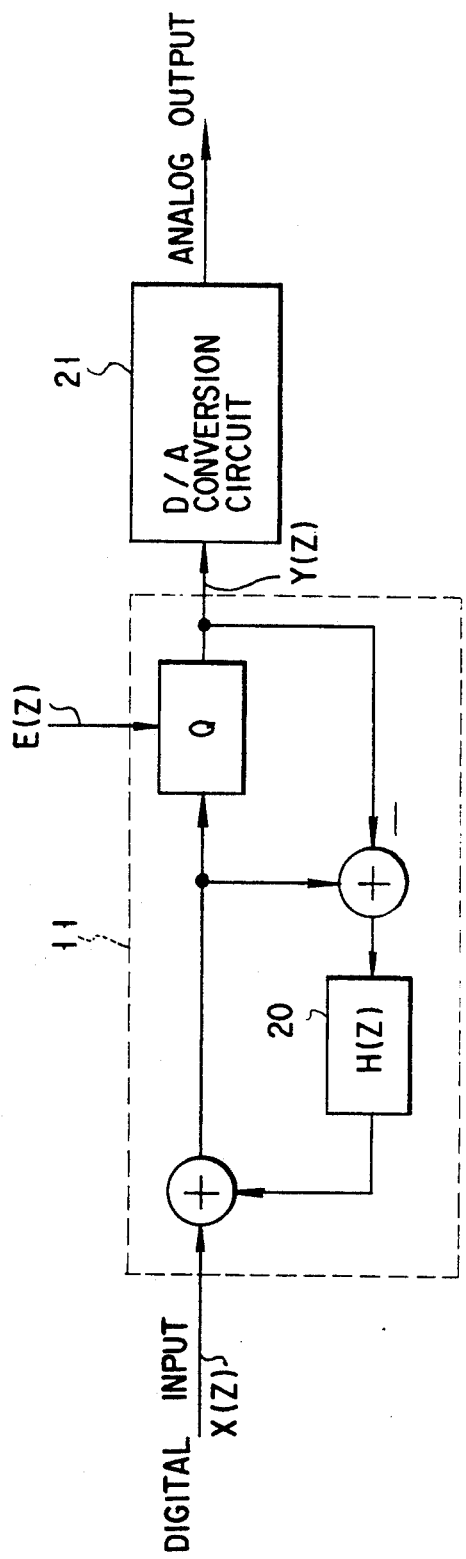
Figure 4:
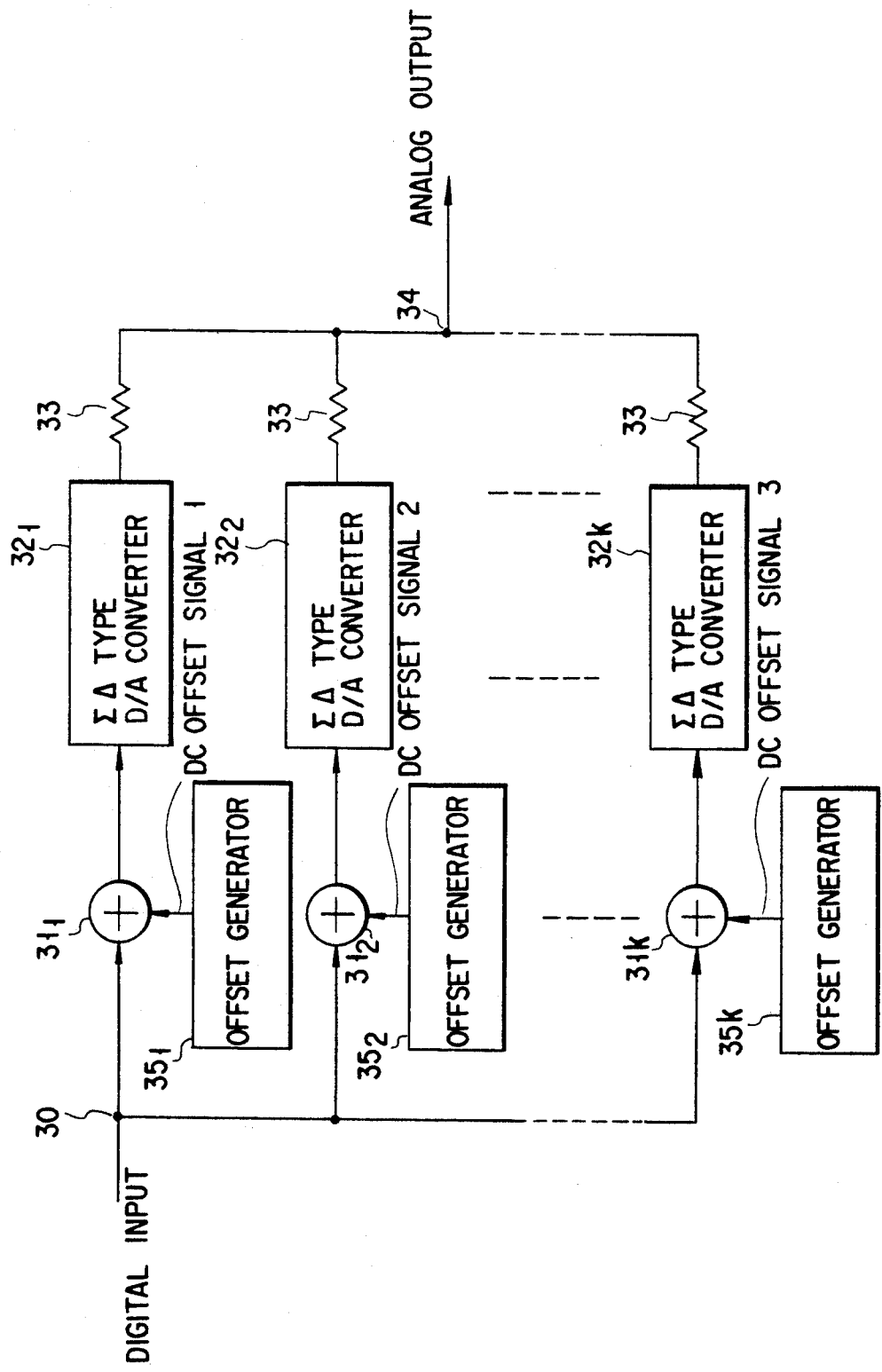
FIG. 4 is a circuit diagram of a preferred embodiment of the $\Sigma\Delta$ type D/A converter system of the present invention.

FIG. 4 is a circuit diagram showing the basic configuration of the first preferred embodiment of the $\Sigma\Delta$ type D/A converter system of the invention. In FIG. 4, k adders $31_1, 31_2, \ldots, 31_k$ are connected in parallel to the input node 30 of the system. The adders $31_1, 31_2, \ldots, 31_k$ are connected to respective $\Sigma\Delta$ type D/A converters $32_1, 32_2, \ldots, 32_k$. The k $\Sigma\Delta$ type D/A converters $32_1, 32_2, \ldots, 32_k$ are then connected to the output node 34 of the system by way of respective resistors 33.

A $\Sigma\Delta$ type D/A converter system having a configuration as described above operates in a manner as described below. Firstly, an identical digital signal is given to each of the k (k=natural number equal to or greater than 2) adders $31_1, 31_2, \ldots, 31_k$ via the input node 30. Besides, a total of k different DC (direct current) offset signals are given to the respective adders $31_1, 31_2, \ldots, 31_k$. For example, the adder $31_1$ may receive DC offset signal 1 produced by offset signal generator $35_1$, the adder $31_2$ may receive DC offset signal 2 produced by offset signal generator $35_2$ and, in a similar manner, the adder $31_k$ may receive DC offset signal k produced by offset signal generator $35_k$. Each of the adders $31_1, 31_2, \ldots, 31_k$ adds the digital signal and the DC offset signal given to it so that the k digital signals become mutually not correlated. The output signals of the adders $31_1, 31_2, \ldots, 31_k$ are then given to the respective $\Sigma\Delta$ type D/A converters $32_1, 32_2, \ldots, 32_k$.

The $\Sigma\Delta$ type D/A converters $32_1, 32_2, \ldots, 32_k$ generate quantization noise because of the quantizers they comprise. The waveform of the quantization noise generated by the converters is determined by the digital signal (input signal) applied to them.

With the above described embodiment, however, since different DC offset signals are added to the respective digital signals which are k in number, these k digital signals are mutually not correlated. Consequently, the quantization noises which are added to the respective digital signals that are not mutually correlated in the respective quantizers are not mutually correlated.

Thereafter, the output signals (analog signals) of the k $\Sigma\Delta$ type D/A converters $32_1, 32_2, \ldots, 32_k$ are summed up at the output node 34. It has been proved that, while the sum of the output signals (analog signals) is consequently equal to one of the output signals multiplied by k, that of the quantization noises of the output signals is equal to one of the quantization noises multiplied by $k^{\frac{1}{2}}$. This is because the quantization noises are not mutually correlated and, therefore, only their powers are added when the output signals of the $\Sigma\Delta$ type D/A modulators are summed up.

If identical $\Sigma\Delta$ type modulators are used, their S/N level will be improved by $10\cdot\log\{k\}$dB as the mean value of the powers of their quantization noises are equal to each other.

Referring to FIG. 4, it will be seen that the quantization noises can be strongly correlated if the DC offset signals 1 through k are arranged close to one another. If such is the case, the sum of such output signals of the $\Sigma\Delta$ type D/A converters having such offset signals can contain a beat component in the audible bandwidth. It has been found by the inventors of the present invention, that the sum of the output signals of a $\Sigma\Delta$ type D/A converter system according to the invention is substantially free from a beat component in the audible bandwidth when any adjacent ones of the DC offset signals 1 through k are separated from each other by approximately 0.2% of the full scale of the $\Sigma\Delta$ type D/A converters.

While output signals of the $\Sigma\Delta$ type D/A converters of a $\Sigma\Delta$ type D/A converter system according to the invention contain DC offset signals, they can be easily removed by using, for instance, capacitors.

Figure 6:
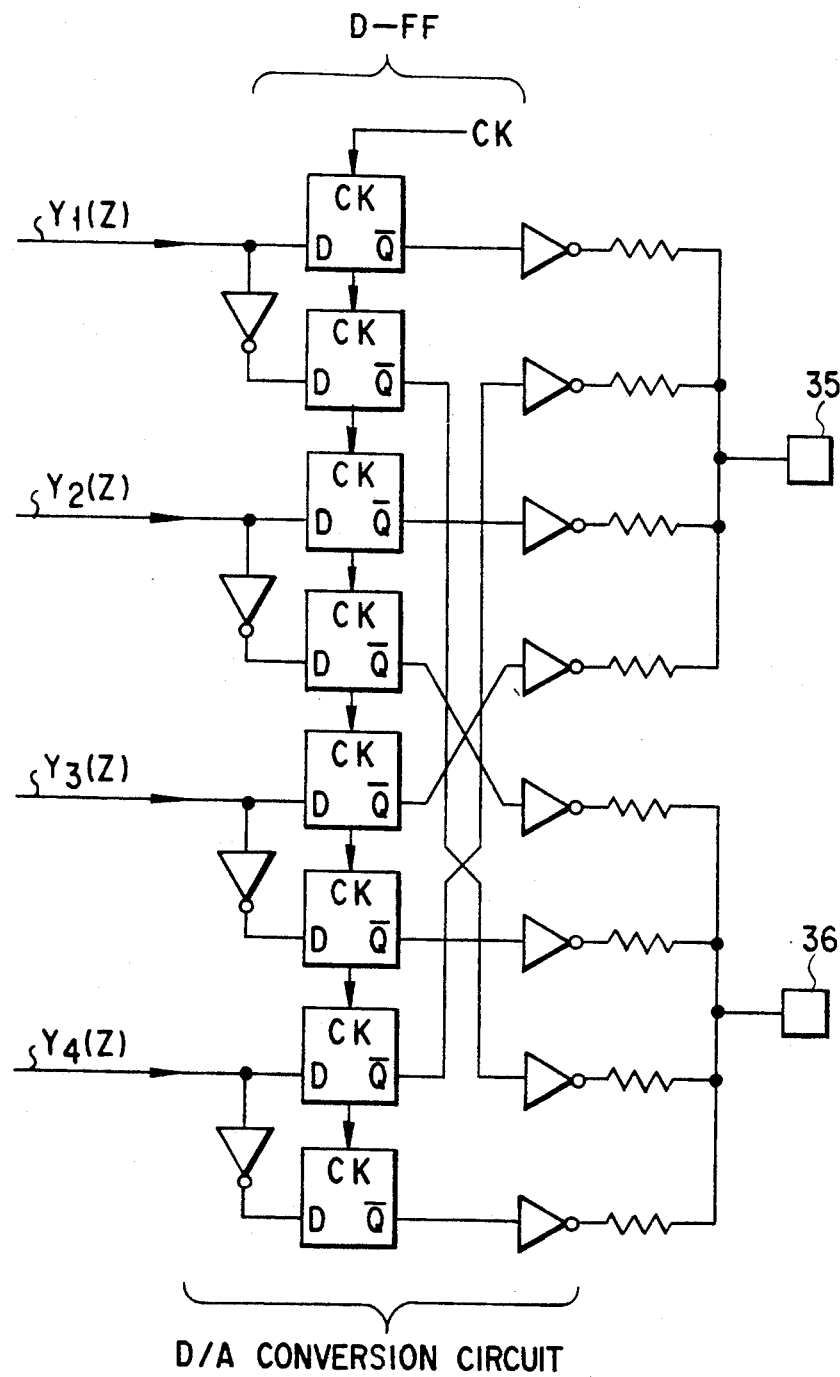

FIGS. 5 and 6 show circuit diagrams of another preferred embodiment of the invention comprising four 1-bit $\Sigma\Delta$ type D/A converters. Since quantization is realized on a 1 bit basis in this embodiment, CMOS inverters are used for the D/A conversion circuit, although the performance of a D/A conversion circuit operated on a 1-bit basis can be degraded if 1-bit data involve jitters.

Figure 7:
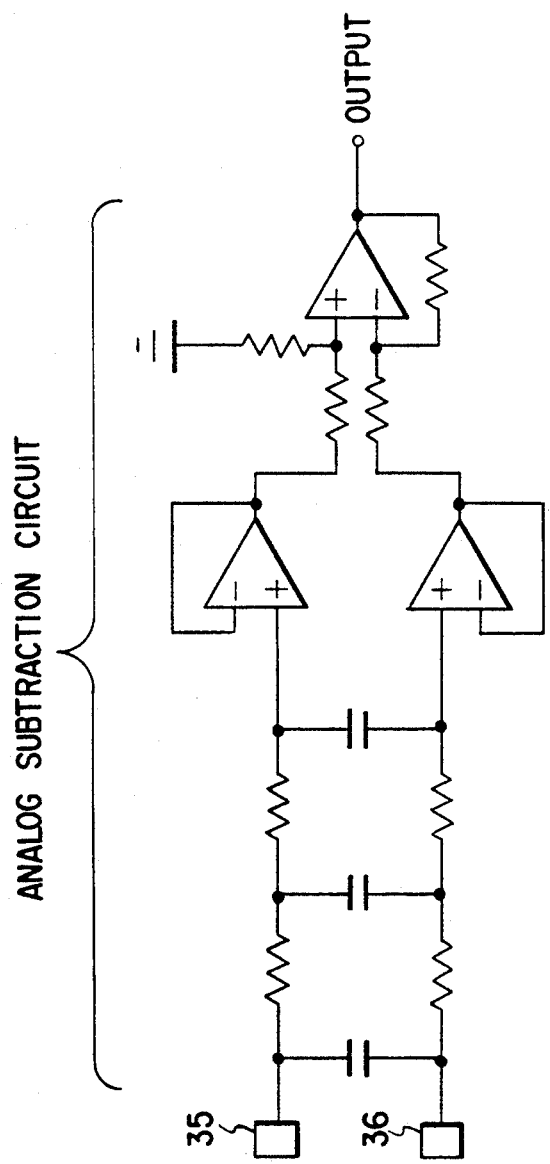
FIG. 7 is a circuit diagram of an analog subtraction circuit to be used for the purpose of the present invention.

The problem of jitters can be eliminated by providing the D/A conversion circuit with D-FFs as illustrated in FIG. 7, to which jitter-free clock signals CKs are given in order to rearrange the synchronization of operation before D/A conversion of signals. Alternatively, the D/A conversion circuit may be provided with a normal output terminal 35 for giving out an output signal (analog signal) and an inverted output terminal 36 for giving out an output signal produced by inverting the output signal for each of the k $\Sigma\Delta$ type D/A converters, the normal and inverted signals being applied to an analog subtraction circuit. With such an arrangement, any secondary distortions due to the differences between the rising edges and the falling edges in the waveforms of the CMOS inverters can be eliminated.

Figure 8:
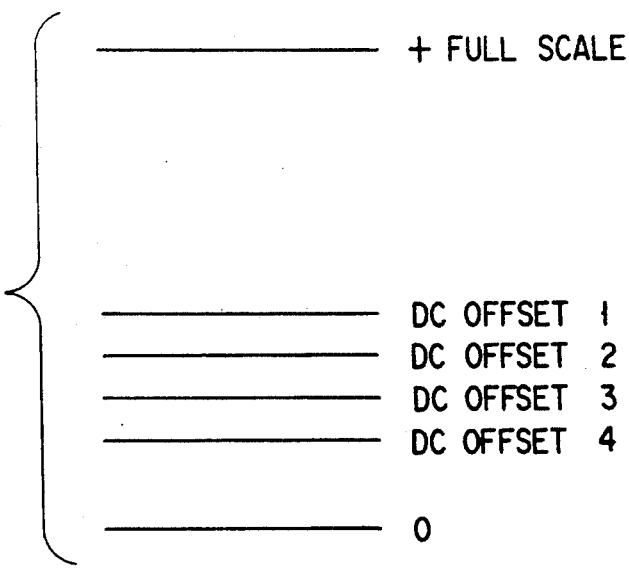
FIG. 8 is a chart showing an example of the levels of DC offsets 1 through 4.

FIG. 8 is a chart showing an example of the levels of DC offsets 1 through 4 obtained by using 1-bit $\Sigma\Delta$ D/A converters of the embodiment of FIGS. 5 and 6. While the levels of DC offset signals 1 through 4 are positive in this example, they may take negative values. The positional relationship of these DC offset signals 1 through 4 is not limited to the one a shown in FIG. 8 and may be appropriately determined. What is necessary here is that any adjacent ones of the DC offset signals 1 through 4 are separated from each other by approximately 0.2% of the full scale of the $\Sigma\Delta$ type D/A converters. With such an arrangement, the quantization noises produced in the D/A converters are not mutually correlated.

Figure 9:
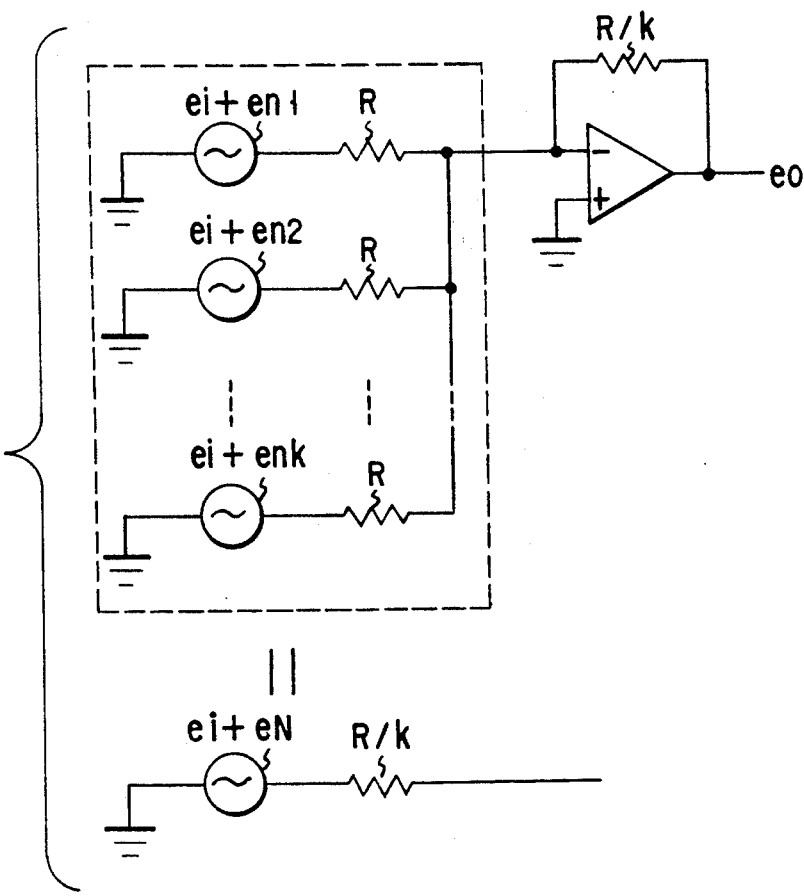
FIG. 9 is a circuit diagram illustrating the effect of the present invention.

FIG. 9 is an equivalent circuit diagram of a $\Sigma\Delta$ type D/A converter system according to the invention. With this circuit, combinations of an identical signal component $e_i$ and each of a group of mutually not correlated noises $e_{nj}$ (j=1, 2, ..., k) are given out to a single point by way of respective resistors and then amplified by a current input amplifier. Considering that the noises are not mutually correlated, the area enclosed by a broken line can be replaced by an equivalent circuit as shown therebelow. Assuming that variance V ($e_n$) of the noises $e_{nj}$ is a constant, formula (8) below will be obtained.

$$e_0 = e_i + e_N \quad (6)$$

$$V(e_N) = (1/k) \cdot V(e_n) \quad (7)$$

$$S/N[dB] = 10 \cdot \log\{V(e_j)/V(e_N)\} = 10 \cdot \log\{V(e_j)/V(e_n)\} + 10 \cdot \log\{k\} \quad (8)$$

where V($e_N$) is the variance of $e_N$ and V($e_i$) is the variance of $e_i$.

From formula (8) above, it may be readily understood that the value of S/N of a $\Sigma\Delta$ type D/A converter is improved by 10·log{k}[dB] and that if one of the source signals contains a beat component, the beat component of the corresponding output signal shows an improvement of 20·log{k}[dB] for the same reason.

Since the output signal of a $\Sigma\Delta$ type D/A converter normally contains a large high frequency pulse component, a large distortion can appear in the slewing rate if it is directly given to an operational amplifier. This problem can be effectively eliminated by arranging a two to three step CR filter as illustrated in FIG. 10. In FIG. 10, $R_1$ through $R_3$ are resistors, $C_1$ through $C_3$ are capacitors and Amp is an operational amplifier. While the operational amplifier there is a voltage follower type, it may be replaced by a current type amplifier.

As is apparent from the above description, the attempts in the past to improve the performance of conventional $\Sigma\Delta$ type D/A converters have been unsuccessful beyond a certain limit because such attempts have been centered on raising the sampling rate and the number of orders of $\Sigma\Delta$ type D/A converters. On the contrary, since a total of k $\Sigma\Delta$ type D/A converters are used to set up a D/A converter system according to the invention, the S/N level can be improved by 10·log{k}[dB] and the beat component contained in quantization noise and having an adverse effect can be reduced by 20·log{k}[dB] in that system. As a result, the present invention can provide a high precision $\Sigma\Delta$ type D/A converter system that can be incorporated into an LSI.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A $\Sigma\Delta$ type D/A converter system comprising:
   a total of k adders for receiving an identical digital signal and respective DC offset signals different from one another, each of said adder circuits outputting a signal representing the sum of said digital signal and said DC offset signal;
   a total of k $\Sigma\Delta$ type D/A converters connected with the respective adders to form a plurality of adder and $\Sigma\Delta$ type D/A converter pairs, the output signals of said adders being converted into corresponding analog signals by the respective $\Sigma\Delta$ type D/A converters; and
   output means for producing a signal by summing up the output signals of said k $\Sigma\Delta$ type D/A converters.

2. A $\Sigma\Delta$ type D/A converter system according to claim 1, wherein any two of the levels of the DC offset signals given to said k adding means differ from each other by equal to or greater than 0.2% of the full scale value of said k $\Sigma\Delta$ type D/A converters.

3. A $\Sigma\Delta$ type D/A converter system according to claim 1, wherein each of said total of k $\Sigma\Delta$ type D/A converters comprises:
   an adder for adding a digital signal and a feedback signal;
   a quantizer for quantizing the output signal of said adder;
   a subtracter for calculating the difference of the output signal of said quantizer and that of said adder;
   a filter circuit for producing said feedback signal by digitally processing the output signal of said subtracter; and
   a D/A conversion circuit for converting the output signal of said quantizer into an analog signal.

4. A $\Sigma\Delta$ type D/A converter system according to claim 1, wherein said output means is provided with a normal output terminal for outputting a normal output signal and an inverted output terminal for outputting an inverted output signal produced by inverting the output signal for each of said k $\Sigma\Delta$ type D/A converters.

* * * * *